United States Patent
Won et al.

(10) Patent No.: US 6,472,319 B2
(45) Date of Patent: Oct. 29, 2002

(54) METHOD FOR MANUFACTURING CAPACITOR OF SEMICONDUCTOR MEMORY DEVICE BY TWO-STEP THERMAL TREATMENT

(75) Inventors: Seok-jun Won, Seoul (KR); Yun-jung Lee, Seoul (KR); Soon-yeon Park, Daegu (KR); Cha-young Yoo, Kyungki-do (KR); Doo-sup Hwang, Kyungki (KR); Eun-ae Chung, Kyungki-do (KR); Wan-don Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/851,910

(22) Filed: May 9, 2001

(65) Prior Publication Data

US 2002/0076878 A1 Jun. 20, 2002

(30) Foreign Application Priority Data

Dec. 19, 2000 (KR) ........................................ 2000-78547

(51) Int. Cl.$^7$ ................................................ H01L 21/44
(52) U.S. Cl. .................... 438/660; 438/240; 438/253; 438/393; 438/396; 438/296
(58) Field of Search ................................ 438/660, 240, 438/253, 393, 396, 296

(56) References Cited

U.S. PATENT DOCUMENTS

| | | | | | |
|---|---|---|---|---|---|
| 5,780,115 A | * | 7/1998 | Park et al. | ................ | 427/255.7 |
| 5,973,911 A | * | 10/1999 | Nishioka | ................ | 257/295 |
| 6,022,774 A | * | 2/2000 | Kawai et al. | ................ | 438/240 |
| 6,096,593 A | * | 8/2000 | Joo et al. | ................ | 438/238 |
| 6,274,454 B1 | | 8/2001 | Katori | ................ | 438/396 |
| 6,376,299 B1 | * | 4/2002 | Joo et al. | ................ | 257/295 |
| 6,403,441 B1 | * | 6/2002 | Takehiro et al. | ................ | 257/306 |

FOREIGN PATENT DOCUMENTS

| | | | | |
|---|---|---|---|---|
| GB | 2256747 | 12/1992 | ........... | H01L/29/76 |
| GB | 2326279 | 12/1998 | ........... | H01G/4/10 |
| GB | 2334816 | 1/1999 | ........... | H01G/4/33 |

OTHER PUBLICATIONS

Search and Examination Report for Great Britain Application No. 0115702.3 dated Feb. 21, 2002.

* cited by examiner

Primary Examiner—Matthew Smith
Assistant Examiner—V. Yevsikov
(74) Attorney, Agent, or Firm—Myers Bigel Sibley & Sajovec

(57) ABSTRACT

A method for manufacturing a capacitor of a semiconductor memory device by a two-step thermal treatment is provided. A lower electrode is formed on a semiconductor substrate. A dielectric layer is formed over the lower electrode. An upper electrode formed of a noble metal is formed over the dielectric layer. The resultant having the upper electrode undergoes a first thermal treatment under a first atmosphere including oxygen at a first temperature which is selected to be within a range of 200–600° C., which is lower than the oxidation temperature of the upper electrode. The first thermally treated resultant undergoes a second thermal treatment under a second atmosphere without oxygen at a second temperature which is selected to be within a range of 300–900° C., which is higher than the first temperature.

48 Claims, 5 Drawing Sheets

METHOD FOR MANUFACTURING CAPACITOR OF SEMICONDUCTOR MEMORY DEVICE BY TWO-STEP THERMAL TREATMENT

REFERENCE TO PRIORITY APPLICATION

This application claims priority to Korean Application No. 2000-78547, filed Dec. 19, 2000, the disclosure which is hereby incorporated herein by reference.

FIELD OF THE INVENTION

The present invention relates to a method for manufacturing a semiconductor memory device, and more particularly, to a method for manufacturing a capacitor including a thermal treatment process for improving the electrical properties of a capacitor.

BACKGROUND OF THE INVENTION

As the integration density of semiconductor memory devices is increased, the space taken up by a memory cell area is typically decreased. A decrease in cell capacitance is typically a serious obstacle to increasing the integration of a dynamic random access memory (DRAM) devices having storage capacitors. A decrease in the cell capacitance not only lowers the ability to read a memory cell and increases a soft error rate, but also makes the operation of a device at low voltage difficult, and makes the power consumption excessive during the operation of a device. Therefore, a method which can increase cell capacitance should be developed for manufacturing a highly integrated semiconductor memory device.

Generally, dielectric properties of the cell capacitance can be evaluated by the equivalent oxide thickness (Toxeq) and the leakage current density. The Toxeq is a value obtained by converting the thickness of a dielectric layer formed of a material other than a silicon oxide substance into the thickness of a dielectric film formed of a silicon oxide substance. As the value of the Toxeq becomes smaller, the capacitance increases. Also, it is preferable that the leakage current density has a small value in order to improve the electrical properties of a capacitor.

For increasing the cell capacitance, research is being done on methods in which a silicon nitride layer or a silicon oxide layer is replaced by a high dielectric layer having a high dielectric constant as a dielectric layer of a capacitor. Accordingly, a dielectric metal oxide, such as $Ta_2O_5$, (Ba, Sr)$TiO_3$ (BST), Pb(Zr, Ti)$O_3$ (PZT), is noticed as a strong candidate as a capacitor dielectric layer material for a semiconductor memory device giving a large capacitance.

For manufacturing a capacitor which employs a dielectric layer having a high dielectric constant, generally, a thermal treatment is performed under an atmosphere including oxygen after an upper electrode is formed, in order to improve the leakage current properties and dielectric properties of the capacitor. Thermal treatment improves the leakage current properties of the capacitor, but the temperature of the thermal treatment must be high in order to obtain an effect of satisfactorily improving the leakage current properties. Also, to obtain electrical properties of a satisfactory level, the temperature of the thermal treatment after forming an upper electrode depends on the kind of dielectric layer used and the state of thermal treatment of the dielectric layer.

In order to obtain capacitance of a reasonable level in a semiconductor device which is continuously integrated, a technique of employing a precious material such as Ru and Pt as an electrode material has been developed. For example, in the case where a $Ta_2O_5$ layer crystalized under an atmosphere of nitrogen is formed as a dielectric layer, the leakage current properties can be improved only by thermal treatment at a temperature equal to or higher than 500° C. under the atmosphere of oxygen after forming an upper electrode. However, in the case where an Ru layer is formed by a chemical vapor deposition (CVD) method over the $Ta_2O_5$ layer as an upper electrode, the upper electrode formed of Ru is oxidized if the temperature of the thermal treatment under the atmosphere of oxygen is equal to or higher than 450° C. after forming the upper electrode, so that it is difficult to perform thermal treatment at a temperature equal to or higher than 450° C. In the case where the $Ta_2O_5$ layer is formed as a dielectric layer, an effect of improving the leakage current is very small at a thermal treatment temperature of 400° C.

Also, in the case where a BST layer formed by the CVD method is employed as a dielectric layer, satisfactory electrical properties can be obtained only by thermal treatment at a temperature equal to or higher than 500° C. under the atmosphere of oxygen after forming an upper electrode. However, in the case where an Ru layer is formed as an upper electrode, the Ru layer begins to rapidly oxidize at a temperature of equal to or higher than 450° C., so that it is impossible to perform thermal treatment at a temperature of equal to or higher than 500° C.

SUMMARY OF THE INVENTION

To solve the above problems, it is an objective of the present invention to provide a method for manufacturing a capacitor of a semiconductor memory device which can effectively improve the electrical properties of a capacitor by restraining the oxidation of an upper electrode without lowering the thermal treatment temperature in order to improve the leakage current properties and dielectric properties of a capacitor.

Accordingly, to achieve the above objective, there is provided a method for manufacturing a capacitor of a semiconductor memory device according to an aspect of the present invention, wherein a lower electrode is formed on a semiconductor substrate. A dielectric layer is formed over the lower electrode. An upper electrode formed of a noble material is formed over the dielectric layer. The resultant structure having the upper electrode then undergoes a first thermal treatment under a first atmosphere including oxygen the first temperature which is selected to be within the range of 200–600° C., which is lower than the oxidation temperature of the upper electrode. The first thermally treated resultant structure undergoes a second thermal treatment under a second atmosphere without oxygen and at a second temperature which is selected to be within the range of 300–900° C., which is higher than the first temperature.

The lower electrode can be formed of a single layer formed of doped polysilicon, TiN, TaN, WN, W, Pt, Ru, Ir, $RuO_2$, or $IrO_2$, or a complex layer thereof. The dielectric layer can be formed of a single layer of $Ta_2O_5$, $TiO_2$, (Ba, Sr)$TiO_3$ (BST), St$TiO_3$ (ST), $SiO_2$, $Si_3N_4$, or PbZr$TiO_3$ (PZT), or a complex layer thereof. The upper electrode can be formed of Ru, Pt, Ir, $RuO_2$, or $IrO_2$. In the first thermal treatment step, the first atmosphere includes oxygen having a concentration of 0.01–100 volume %. Here, the first atmosphere can include $O_2$, $N_2O$, or $O_3$ gas. Also, in the second thermal treatment step, the second atmosphere is an inert gas atmosphere or a high vacuum atmosphere. The first and second thermal treatment steps can be performed in-situ in the same chamber.

A method for manufacturing a capacitor of a semiconductor memory device according to the aspect of the present invention further includes a step of forming a silicon nitride layer which covers the lower electrode after forming the lower electrode. Also, a method for manufacturing a capacitor of a semiconductor memory device according to the aspect of the present invention further includes a step of thermally treating the dielectric layer after forming the dielectric layer. If the dielectric layer is thermally treated under an atmosphere including oxygen, it is thermally treated at a temperature of 200–800° C. If the dielectric layer is thermally treated under an atmosphere without oxygen, it is thermally treated at a temperature of 500–800° C.

In a method for manufacturing a capacitor of a semiconductor memory device according to another aspect of the present invention, a lower electrode is formed on a semiconductor substrate. A dielectric layer formed of a $Ta_2O_5$ layer is formed over the lower electrode. The dielectric layer is thermally treated. An upper electrode formed of Ru is formed over the thermally treated dielectric layer. The resultant structure having the upper electrode undergoes a first thermal treatment under a first atmosphere including oxygen and at a first temperature which is selected to be within a rage of 300–500° C., which is lower than the oxidation temperature of the upper electrode. The first thermally treated resultant structure undergoes a second thermal treatment under a second atmosphere without oxygen and at a second temperature which is selected to be within a range of 500–700° C., which is higher than the first temperature.

According to the present invention, in order to improve the electrical properties of a capacitor, the surface of an upper electrode is not oxidized and an effect of curing a dielectric layer can be sufficiently obtained by a two-step thermal treatment after forming the upper electrode so that leakage current properties and dielectric properties of a capacitor are improved, and enhanced electrical properties can be obtained.

DESCRIPTION OF PREFERRED EMBODIMENTS

Figure 1A:
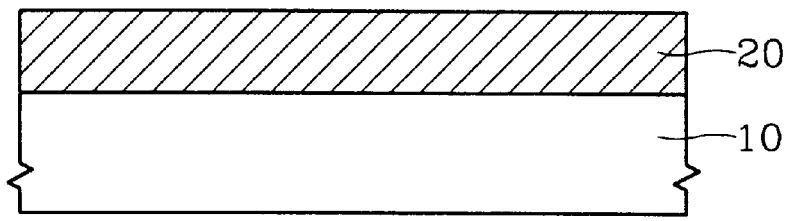
FIGS. 1A through 1G are sectional views illustrating, in the processing order, a method for manufacturing a capacitor of a semiconductor memory device according to a preferred embodiment of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same element, and thus their description will be omitted.

FIGS. 1A through 1G are sectional views illustrating, in the processing order, a method for manufacturing a capacitor of a semiconductor memory device according to a preferred embodiment of the present invention. Referring to FIG. 1A, a lower electrode 20 is formed on a semiconductor substrate 10. The lower electrode 20 can be formed of a single layer formed of a conductive material such as doped polysilicon, W, Pt, Ru, Ir, a conductive metal nitride such as TiN, TaN, WN, or a conductive metal oxide such as $RuO_2$, $IrO_2$, or a complex layer thereof.

Figure 1B:
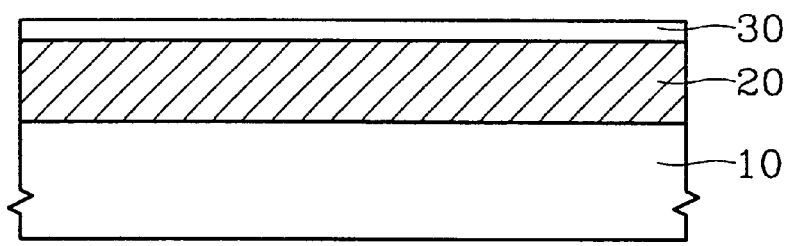

Referring to FIG. 1B, a silicon nitride layer 30 which covers the lower electrode 20 is formed. The reason for forming the silicon nitride layer 30 is to prevent the equivalent oxide thickness (Toxeq) from becoming higher due to oxidation of the lower electrode 20 during the following process. The silicon nitride layer 30 is effective in particular when the lower electrode 20 is formed of doped polysilicon. In order to form the silicon nitride layer 30, the resultant structure having the lower electrode 20 can be thermally treated by exposing the lower electrode 20 to an $NH_3$ atmosphere. Alternatively, it is possible to use a method of depositing an $Si_3N_4$ layer using CVD. The silicon nitride layer 30 is preferably formed to be in a thickness range of about 5–30 Å. The step of forming the silicon nitride layer 30 can be omitted as occasion demands.

Figure 1C:
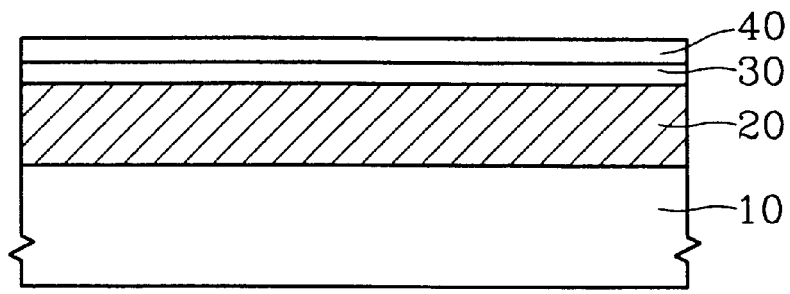
Figure 1D:
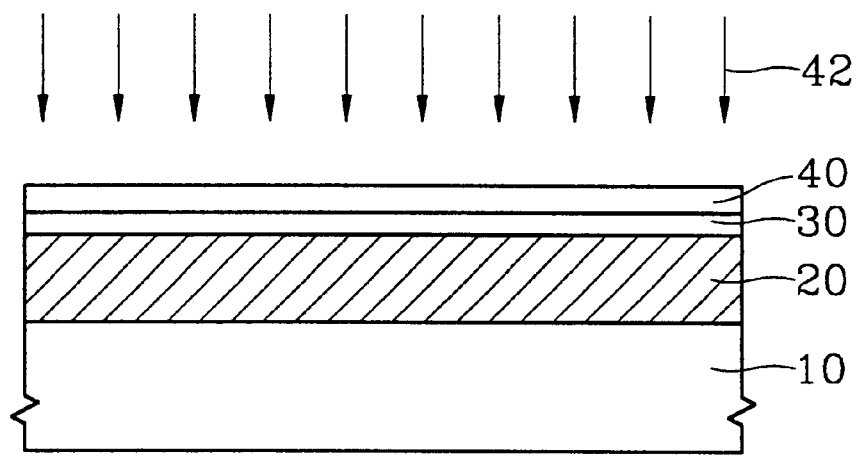

Referring to FIG. 1C, a dielectric layer 40 is formed on the entire surface of the resultant structure having the silicon nitride layer 30. The dielectric layer 40 can be formed of a single layer of $Ta_2O_5$, $TiO_2$, $(Ba, Sr)TiO_3$ (BST), $StTiO_3$ (ST), $SiO_2$, $Si_3N_4$, or $PbZrTiO_3$ (PZT), or a complex layer thereof. If a $Ta_2O_5$ layer is used as the dielectric layer 40, it is preferable that the thickness is within a range of about 40–100 Å. Referring to FIG. 1D, the dielectric layer 40 undergoes thermal treatment 42. If a $Ta_2O_5$ layer is formed as the dielectric layer 40, the thermal treatment 42 can be performed at a temperature of 200–900° C. The thermal treatment 42 can be performed under an inert gas atmosphere without oxygen or an atmosphere including oxygen. If the thermal treatment 42 of the dielectric layer 40 is performed under an inert gas atmosphere, the temperature of the thermal treatment 42 can be selected to be in a range of 500–800° C. Also, if the thermal treatment 42 of the dielectric layer 40 is performed under an atmosphere including oxygen, the temperature of the thermal treatment 42 can be selected to be in a range of 200–800° C. $O_2$, $N_2O$, or $O_3$ gas can be used to perform the thermal treatment 42 of the dielectric layer 40 under the atmosphere including oxygen. The thermal treatment 42 leads to crystallization of the dielectric layer 40, and decrease of an influence from the subsequent high-temperature thermal treatment process, so that the electrical properties can be improved.

Figure 1E:
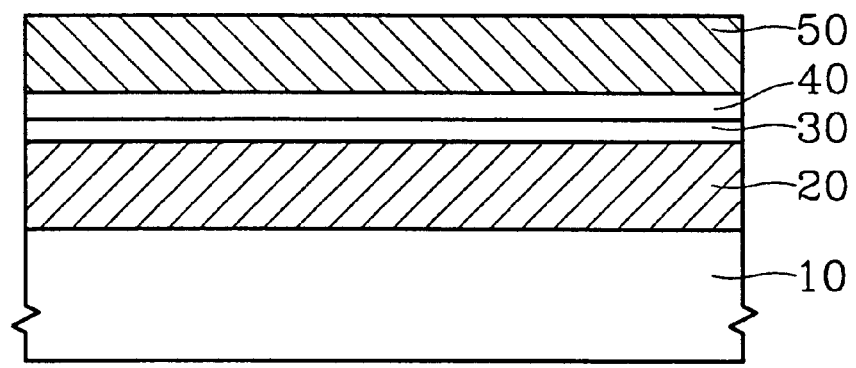

Referring to FIG. 1E, an upper electrode 50 is formed over the dielectric layer 40 which underwent the thermal-treatment 42. The upper electrode 50 can be formed of a group VIII noble metal, for example, Ru, Pt and Ir, and can be formed of a conductive precious metal oxide such as $RuO_2$ and $IrO_2$, which plays the role of a catalyst for decomposition of oxygen molecules, and has some permeability for oxygen.

Figure 1F:
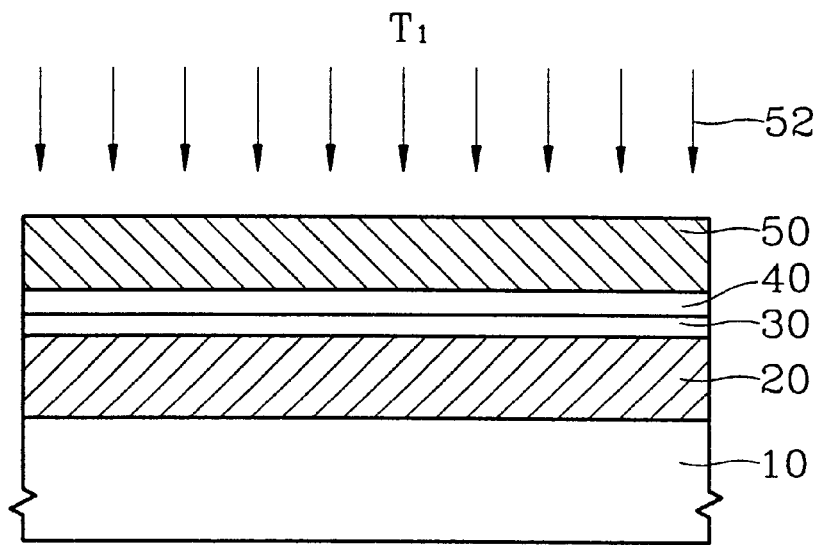

Referring to FIG. 1F, the resultant structure having the upper electrode 50 undergoes a first thermal treatment 52 under a first atmosphere including oxygen and at a first temperature ($T_1$) which is selected to be within a range of 200–600° C., which is lower than the oxidation temperature of the upper electrode 50. Here, the first atmosphere including oxygen includes oxygen having a concentration of 0.01–100 volume %, preferably about 5 volume %. To achieve this, the first atmosphere can include $O_2$, $N_2O$, or $O_3$ gas. Here, the other gas of the first atmosphere is formed of inert gas such as $N_2$ or Ar. For example, if the dielectric layer 40 is formed of a $Ta_2O_5$ layer, and the upper electrode 50 is formed of an Ru layer deposited by the CVD method, the first temperature ($T_1$) of the first thermal treatment 52 can be 300–500° C., preferably 350–450° C. Since the first thermal treatment 52 performed under the first atmosphere including oxygen is performed at the first temperature ($T_1$) lower than the oxidation temperature of the upper electrode 50, the exposed surface of the upper electrode 50 is not oxidized, and oxygen included in the first atmosphere penetrates the upper electrode 50. As a result, oxygen atoms are piled up near the interface between the upper electrode 50 and the dielectric layer 40. The oxygen atoms piled up near the interface do not cure the dielectric layer 40 due to the low reaction temperature, and remain around the interface in its unreacted state. For the first thermal treatment 52, it is possible to use a furnace or a single wafer type thermal processing apparatus. Preferably, the first thermal treatment 52 is performed in a rapid thermal processing (RTP) furnace.

Figure 1G:
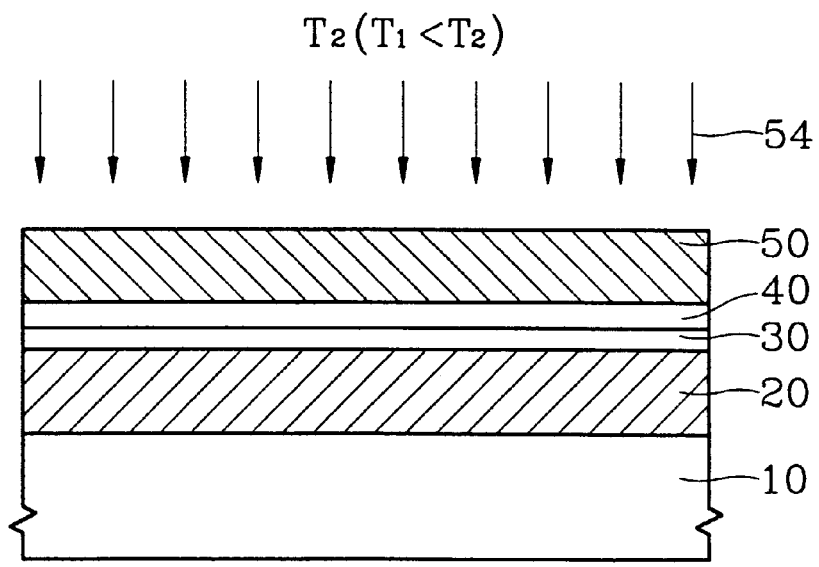

Referring to FIG. 1G, the resultant structure which underwent the first thermal treatment 52 undergoes a second thermal treatment 54 under a second atmosphere without oxygen. The second thermal treatment 54 is performed at the second temperature ($T_2$) which is selected to be within a range of 300–900° C., which is higher than the first temperature ($T_1$). For the second thermal treatment 54, it is possible to use a furnace or a single wafer type thermal processing apparatus. Preferably, the first thermal treatment 52 and the second thermal treatment 54 are performed in-situ in the same chamber. For the second thermal treatment 54, the second atmosphere can be an inert gas atmosphere such as $N_2$ or Ar, or a high vacuum atmosphere.

For example, if the dielectric layer 40 is formed of a $Ta_2O_5$ layer, and the upper electrode 50 is formed of an Ru layer deposited by the CVD method, the second temperature ($T_2$) of the second thermal treatment 54 can be 500–700° C., preferably 600–650° C. The second temperature ($T_2$) applied during the second thermal treatment 54 is selected to be sufficient to cure the oxygen vacancy within the dielectric layer 40, and remove dangling bonds present on the interface between the upper electrode 50 and the dielectric layer 40. For the thermal treatment to improve the electrical properties of a capacitor, a two-step thermal treatment formed of the first thermal treatment 52, which is performed on the resultant having the upper electrode 50 under the first atmosphere including oxygen at the first temperature ($T_1$) lower than the oxidation temperature of the upper electrode 50, and the second thermal treatment 54, which is performed under the second atmosphere without oxygen at the second temperature ($T_2$) higher than the first temperature ($T_1$), are successively performed, so that the surface of the upper electrode 50 is not oxidized, and an effect of curing the dielectric layer 40 can be sufficiently obtained. Therefore, leakage current properties and dielectric properties of a capacitor can be improved without oxidation of the upper electrode 50.

Figure 2A:
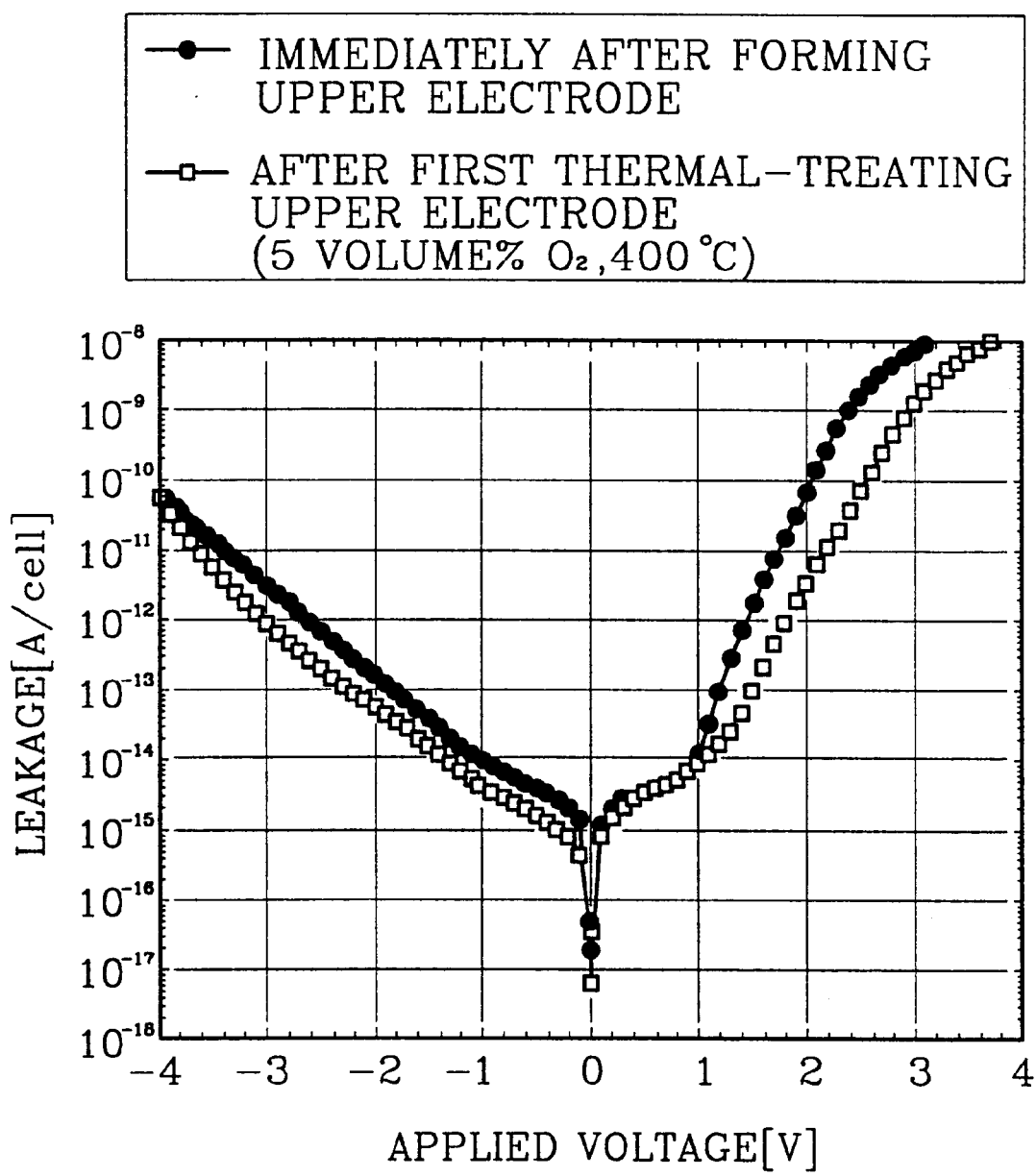
FIGS. 2A and 2B are graphs illustrating results of evaluating the leakage current properties of a capacitor manufactured by a method according to the present invention.
Figure 2B:
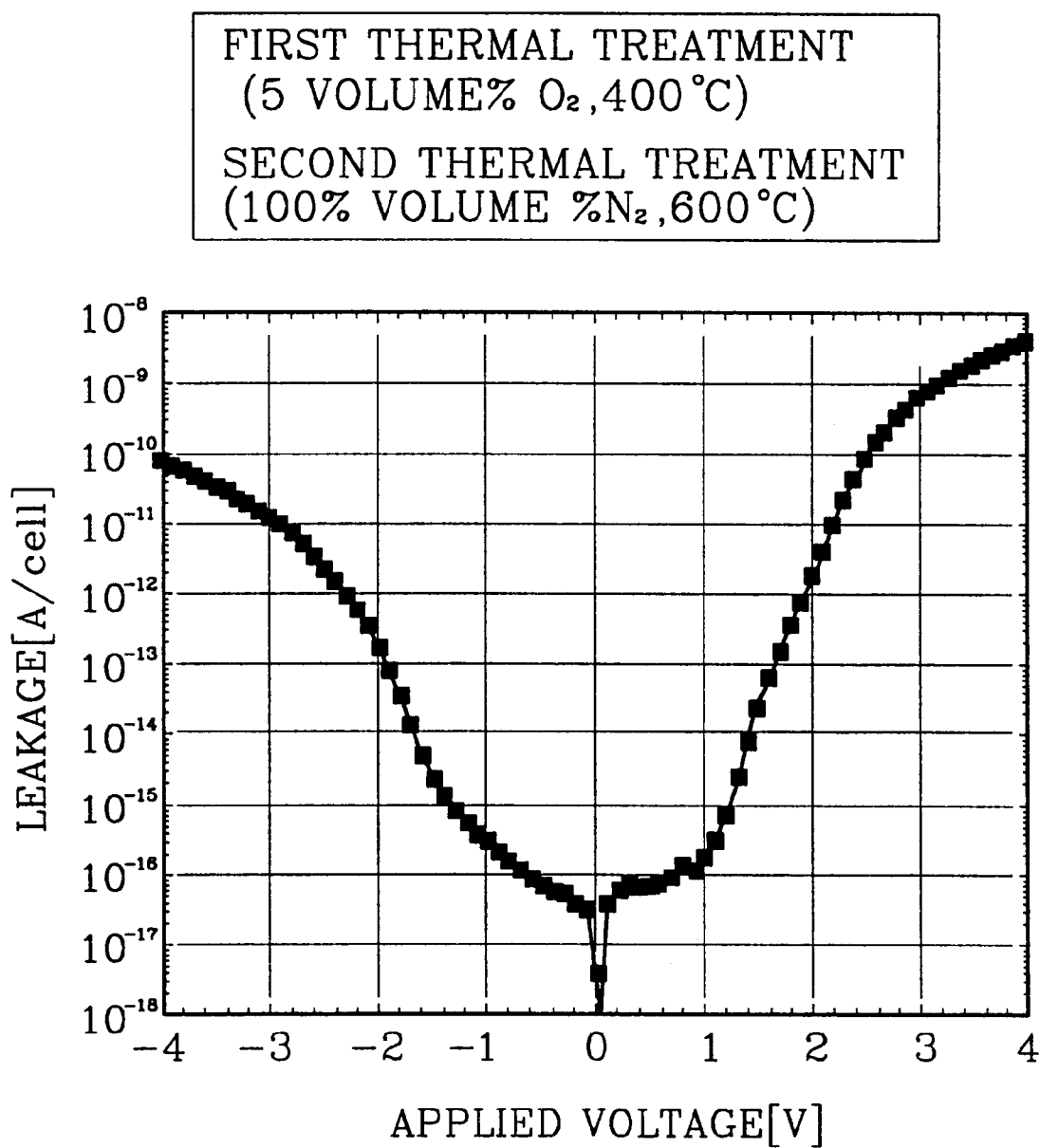

FIGS. 2A and 2B are graphs illustrating the results of evaluating the leakage current properties of a capacitor manufactured by a method according to the present invention. FIG. 2A illustrates the results of evaluating a comparative example, and FIG. 2B illustrates a result of evaluating a capacitor manufactured by a method according to the present invention. For the evaluation of FIGS. 2A and 2B, after a lower electrode formed of dope polysilicon was formed on a semiconductor substrate to have a thickness of 400 Å, a rapid thermal nitridation (RTN) was performed, and a silicon nitride layer was formed on the lower electrode. Next, a dielectric layer formed of a $Ta_2O_5$ was formed on the silicon nitride layer using the CVD method to have a thickness of 90 Å. After the dielectric layer was thermally treated under the $N_2$ atmosphere at a temperature of 700° C., and crystalized, an Ru layer was formed to have a thickness of 800 Å on the dielectric layer using the CVD method, and patterned to form an upper electrode. Next, under an atmosphere including $O_2$ of 5 volume % and the remnant $N_2$ gas, the resultant having the upper electrode underwent a first thermal treatment at a temperature of 400° C. at which the upper electrode is not oxidized, and then as the result of evaluating leakage current, the result was obtained as illustrated in FIG. 2A. In FIG. 2A, the result (-●-) of measuring leakage current immediately after forming the upper electrode, and the result (-□-) of measuring leakage current after the first thermal treatment of the resultant having the upper electrode under the above conditions are illustrated together. From the result of FIG. 2A, when the result having the upper electrode underwent a first thermal treatment under the above conditions, an effect of improving leakage current is not large compared with the leakage current before the first thermal treatment. This is because curing of the dielectric layer is not sufficiently performed.

FIG. 2B illustrates a result of evaluating leakage current obtained after the result of the first thermal treatment undergoes an additional second thermal treatment under an atmosphere of 100 volume % $N_2$ and at a temperature of 600° C. according to the above conditions. If the second thermal treatment is performed according to the above conditions, it is confirmed from the result of FIG. 2B that leakage current properties in a low voltage region are greatly improved.

The reason why the above results are obtained is as follows. Oxygen included in the atmosphere of the first thermal treatment does not oxidize the surface of the upper electrode, and penetrates into the upper electrode. However, at the first thermal treatment temperature of 400° C., the reaction temperature is not sufficient, so that defects present within the dielectric layer are not cured, and the oxygen is piled up near the interface between the upper electrode and the dielectric layer. Oxygen atoms piled up near the interface undergo the second thermal treatment, and the defects within the dielectric layer are cured. That is, the reason why the effect of improving leakage current properties after the first thermal treatment under the atmosphere including oxygen at 400° C. is insufficient is not because of insufficient supply of oxygen but because of a reaction degree between the supplied oxygen and the defects within a dielectric layer.

In a method for manufacturing a capacitor of a semiconductor memory device according to the present invention, after forming an upper electrode, for a thermal treatment to improve the electrical properties of the capacitor, a first thermal treatment is performed on the result having the upper electrode at the first temperature including oxygen at the first temperature lower than the oxidation temperature of the upper electrode, and then the second thermal treatment is performed under the second atmosphere without oxygen at the second temperature higher than the first temperature. By a two-step thermal treatment formed including the first and second thermal treatments, the surface of the upper electrode is not oxidized, and an effect of curing a dielectric layer can be sufficiently obtained. Therefore, leakage properties and dielectric properties of a capacitor are improved, and improved electrical properties can be obtained.

While this invention has been particularly shown and described with reference to preferred embodiments thereof, it will be understood by those skilled in the art that various changes in form and details may be made therein without That which is claimed is:

1. A method for manufacturing a capacitor of a semiconductor memory device comprising:
    forming a lower electrode on a semiconductor substrate;
    forming a dielectric layer over the lower electrode;
    forming an upper electrode of a noble metal over the dielectric layer;
    performing a first thermal treatment on the resultant having the upper electrode under a first atmosphere including oxygen at a first temperature which is selected to be within a range of 200–600° C., and lower than the oxidation temperature of the upper electrode; and
    performing a second thermal treatment on the first thermally treated resultant under a second atmosphere without oxygen at a second temperature which is selected to be within a range of 300–900° C., and higher than the first temperature.

2. The method of claim 1, wherein the lower electrode is formed of a doped polysilicon, a metal, a conductive metal nitride, or a conductive metal oxide.

3. The method of claim 2, wherein the lower electrode is formed of a single layer of a doped polysilicon, TiN, TaN, WN, W, Pt, Ru, Ir, $RuO_2$, or $IrO_2$, or a complex layer thereof.

4. The method of claim 1, wherein the dielectric layer is formed of a single layer of $Ta_2O_5$, $TiO_2$, $(Ba, Sr)TiO_3$ (BST), $StTiO_3$ (ST), $SiO_2$, $Si_3N_4$, or $PbZrTiO_3$ (PZT), or a complex layer thereof.

5. The method of claim 1, wherein the upper electrode is formed of Ru, Pt, Ir, $RuO_2$, or $IrO_2$.

6. The method of claim 1, wherein the first atmosphere of the first thermal treatment step includes oxygen having a concentration of 0.01–100 volume %.

7. The method of claim 1, wherein the first atmosphere of the first thermal treatment step includes $O_2$, $N_2O$, or $O_3$ gas.

8. The method of claim 1, wherein the first atmosphere of the first thermal treatment step further includes inert gas.

9. The method of claim 1, wherein the second atmosphere of the second thermal treatment step is an inert gas atmosphere.

10. The method of claim 1, wherein the second atmosphere of the second thermal treatment step is a high vacuum atmosphere.

11. The method of claim 1, wherein the first thermal treatment step is performed in a rapid thermal processing (RTP) furnace.

12. The method of claim 1, wherein the first and second thermal treatment steps are performed in-situ in the same chamber.

13. The method of claim 1, after forming the lower electrode, further comprising:
    forming a silicon nitride layer covering the lower electrode.

14. The method of claim 13, wherein the step of forming the silicon nitride layer includes thermally treating the lower electrode under an $NH_3$ atmosphere.

15. The method of claim 13, wherein the silicon nitride layer is formed by a chemical vapor deposition (CVD) method.

16. The method of claim 13, wherein the silicon nitride layer is formed to have a thickness of 5–30 Å.

17. The method of claim 1, after the step of forming a dielectric layer, further comprising:
    thermally treating the dielectric layer.

18. The method of claim 17, wherein the step of forming the dielectric layer is performed under an atmosphere including oxygen.

19. The method of claim 18, wherein the step of thermally treating the dielectric layer is performed at the temperature of 200–800° C.

20. The method of claim 17, wherein the step of thermally treating the dielectric layer is performed under an atmosphere without oxygen.

21. The method of claim 20, wherein the step of thermally treating the dielectric layer is performed at a temperature of 500–800° C.

22. A method for manufacturing a capacitor of a semiconductor memory device comprising:
    forming a lower electrode on a semiconductor substrate;
    forming a dielectric layer formed of a $Ta_2O_5$ layer over the lower electrode;
    thermally treating the dielectric layer;
    forming an upper electrode of Ru over the thermally treated dielectric layer;
    performing a first thermal treatment on the resultant having the upper electrode under a first atmosphere including oxygen at a first temperature which is selected to be within a range of 300–500° C., and lower than the oxidation temperature of the upper electrode; and
    performing a second thermal treatment on the first thermally treated resultant under a second atmosphere without oxygen at a second temperature which is selected to be within a range of 500–700° C., and higher than the first temperature.

23. The method of claim 22, wherein the lower electrode is formed of a doped polysilicon, a metal, a conductive metal nitride, or a conductive metal oxide.

24. The method of claim 23, wherein the lower electrode is formed of a single layer of a doped polysilicon, TiN, TaN, WN, W, Pt, Ru, Ir, $RuO_2$, or $IrO_2$, or a complex layer thereof.

25. The method of claim 22, wherein the step of thermally treating the dielectric layer is performed under an atmosphere including oxygen.

26. The method of claim 25, wherein the step of thermally treating the dielectric layer is performed at a temperature of 200–800° C.

27. The method of claim 22, wherein the step of thermally treating the dielectric layer is performed under an atmosphere without oxygen.

28. The method of claim 27, wherein the step of thermally treating the dielectric layer is performed at the temperature of 500–800° C.

29. The method of claim 22, wherein the first atmosphere of the first thermal treatment includes oxygen having a concentration of 0.01–100 volume %.

30. The method of claim 22, wherein the first atmosphere of the first thermal treatment step includes $O_2$, $N_2O$, or $O_3$ gas.

31. The method of claim 22, wherein the first thermal treatment step is performed at a temperature of 350–450° C.

32. The method of claim 22, wherein the first atmosphere of the first thermal treatment further includes inert gas.

33. The method of claim 22, wherein the second atmosphere of the second thermal treatment step is an inert gas atmosphere.

34. The method of claim 22, wherein the second thermal treatment step is performed at a temperature of 600–650° C.

35. The method of claim 22, wherein the first and second thermal treatment steps are performed in-situ in the same chamber.

36. The method of claim 22, after forming the lower electrode, further comprising:
   forming a silicon nitride layer covering the lower electrode.

37. A method of fabricating an integrated circuit capacitor, comprising the steps of:
   forming a lower capacitor electrode on a semiconductor substrate;
   forming a dielectric layer on the lower capacitor electrode;
   forming an upper capacitor electrode comprising a noble metal on the dielectric layer, opposite the lower capacitor electrode;
   exposing the upper capacitor electrode to an oxygen containing atmosphere having a first temperature in a range between 200° C. and a first temperature limit that is less than an oxidation temperature of the upper capacitor electrode; and then
   exposing the upper capacitor electrode to an oxygen deficient atmosphere having a second temperature above the oxidation temperature of the upper capacitor electrode.

38. The method of claim 37, wherein said step of forming an upper capacitor electrode is preceded by the step of increasing the crystallinity of the dielectric layer by thermally treating the dielectric layer in an oxygen deficient atmosphere.

39. The method of claim 37, wherein the oxygen deficient atmosphere comprises an inert gas selected from the group consisting of argon and nitrogen.

40. The method of claim 37, wherein said step of forming a dielectric layer is preceded by the step of forming a silicon nitride layer on the lower capacitor electrode.

41. The method of claim 37, wherein said step of exposing the upper capacitor electrode to an oxygen containing atmosphere comprises exposing the upper capacitor electrode to an oxygen containing atmosphere for a duration sufficient to cause migration of oxygen through the upper capacitor electrode and into the dielectric layer.

42. A method of fabricating an integrated circuit capacitor, comprising the steps of:
   forming a lower capacitor electrode on a semiconductor substrate;
   forming a dielectric layer on the lower capacitor electrode;
   forming an upper capacitor electrode, comprising a metal or a metal oxide, on the dielectric layer;
   exposing the upper capacitor electrode to an oxygen containing atmosphere having a first temperature in a range between 200° C. and a first temperature limit that is less than an oxidation temperature of the upper capacitor electrode; and then
   exposing the upper capacitor electrode to an oxygen deficient atmosphere having a second temperature above the oxidation temperature of the upper capacitor electrode.

43. The method of claim 42, wherein the metal or metal oxide is an electrically conductive material selected from the group consisting of Ru, Pt, Ir, $RuO_2$ and $IrO_2$.

44. The method of claim 42, wherein the oxygen deficient atmosphere comprises an inert gas selected from the group consisting of argon and nitrogen.

45. The method of claim 42, wherein said step of forming a dielectric layer is preceded by the step of forming a silicon nitride layer on the lower capacitor electrode.

46. The method of claim 42, wherein said step of exposing the upper capacitor electrode to an oxygen containing atmosphere comprises exposing the upper capacitor electrode to an oxygen containing atmosphere for a duration sufficient to cause migration of oxygen through the upper capacitor electrode and into the dielectric layer.

47. A method of fabricating an integrated circuit capacitor, comprising the steps of:
   forming a lower capacitor electrode on a semiconductor substrate;
   forming a dielectric layer on the lower capacitor electrode;
   forming an upper capacitor electrode, comprising a metal or a metal oxide, on the dielectric layer;
   exposing the upper capacitor electrode to an oxygen containing atmosphere having a first temperature in a range between 200° C. and a first temperature limit that is less than an oxidation temperature of the upper capacitor electrode, for a sufficient duration to accumulate oxygen atoms at an interface between the upper capacitor electrode and the dielectric layer; and then
   exposing the upper capacitor electrode to an oxygen deficient atmosphere having a second temperature that is higher than the oxidation temperature of the upper capacitor electrode and also sufficiently high to cure the dielectric layer through diffusion of the accumulated oxygen into oxygen vacancies within the dielectric layer.

48. The method of claim 47, wherein said step of forming a dielectric layer is preceded by the step of forming a silicon nitride layer on the lower capacitor electrode.

* * * * *